United States Patent
Lee et al.

(10) Patent No.: US 12,065,734 B2
(45) Date of Patent: Aug. 20, 2024

(54) CHAMBER CLEANING DEVICE AND CHAMBER CLEANING METHOD

(71) Applicant: JUSUNG ENGINEERING CO., LTD., Gwangju-Si (KR)

(72) Inventors: Dong Hwan Lee, Gwangju-Si (KR); Jae Ho Kim, Seoul (KR); Hyun Il Kim, Gwangju-Si (KR); Ho Jin Yun, Gwangju-Si (KR); Jae Wan Lee, Gwangju-Si (KR); Byung Gwan Lim, Gwangju-Si (KR)

(73) Assignee: JUSUNG ENGINEERING CO., LTD. (KR)

( * ) Notice: Subject to any disclaimer, the term of this patent is extended or adjusted under 35 U.S.C. 154(b) by 0 days.

(21) Appl. No.: 17/870,804

(22) Filed: Jul. 21, 2022

(65) Prior Publication Data
US 2022/0356569 A1    Nov. 10, 2022

Related U.S. Application Data

(62) Division of application No. 16/966,883, filed as application No. PCT/KR2019/001547 on Feb. 7, 2019, now Pat. No. 11,427,906.

(30) Foreign Application Priority Data

Feb. 8, 2018    (KR) .................. 10-2018-0015852
Jan. 31, 2019    (KR) .................. 10-2019-0013071

(51) Int. Cl.
*C23C 16/44*    (2006.01)
*B08B 5/00*    (2006.01)
(Continued)

(52) U.S. Cl.
CPC ............ *C23C 16/4405* (2013.01); *B08B 5/00* (2013.01); *B08B 9/08* (2013.01); *H01J 37/3244* (2013.01);
(Continued)

(58) Field of Classification Search
CPC ................ H01J 37/3244; H01J 37/32862
See application file for complete search history.

(56) References Cited

U.S. PATENT DOCUMENTS

| 2004/0007248 A1 | 1/2004 | Jang et al. |
| 2006/0216949 A1 | 9/2006 | Hasebe et al. |

(Continued)

FOREIGN PATENT DOCUMENTS

| CN | 107533998 A | 1/2018 |
| JP | H11140675 A | 5/1999 |

(Continued)

OTHER PUBLICATIONS

Machine translation: KR 10-2013-0142972; Lim et al. (Year: 2013).*

(Continued)

*Primary Examiner* — Natasha N Campbell
(74) *Attorney, Agent, or Firm* — Renaissance IP Law Group LLP

(57) ABSTRACT

The present disclosure relates to an apparatus and method for cleaning a chamber, and more particularly, to an apparatus and method for cleaning a chamber, which are capable of cleaning the chamber which is contaminated while depositing a thin film on a substrate. The chamber cleaning method in accordance with an exemplary embodiment is a method for cleaning a chamber configured to deposit a zinc oxide, the method comprising: supplying a chlorine (Cl)-containing gas and a hydrogen (H)-containing gas into a chamber; activating and reacting the separately supplied gases with each other inside the chamber to generate a reaction gas; and firstly cleaning the chamber with the reaction gas.

6 Claims, 5 Drawing Sheets

(51) Int. Cl.
  *B08B 9/08* (2006.01)
  *H01J 37/32* (2006.01)

(52) U.S. Cl.
  CPC ..... *H01J 37/32862* (2013.01); *B08B 2205/00* (2013.01); *H01J 2237/334* (2013.01)

(56) References Cited

U.S. PATENT DOCUMENTS

| | | | |
|---|---|---|---|
| 2008/0083701 A1 | 4/2008 | Shao et al. | |
| 2008/0115808 A1 | 5/2008 | Ramachandran et al. | |
| 2011/0039402 A1* | 2/2011 | Yamazaki | H01J 37/32449 257/E21.119 |
| 2011/0223710 A1 | 9/2011 | Beck | |
| 2014/0083450 A1 | 3/2014 | Ye | |
| 2017/0087602 A1* | 3/2017 | Lee | C11D 17/00 |
| 2018/0174869 A1* | 6/2018 | Ha | H01L 21/67248 |

FOREIGN PATENT DOCUMENTS

| | | |
|---|---|---|
| JP | H11149998 A | 6/1999 |
| JP | 2006060167 A | 3/2006 |
| JP | 2011054950 A | 3/2011 |
| JP | 2013087346 A | 5/2013 |
| KR | 20000051046 A | 8/2000 |
| KR | 100785443 B1 | 12/2007 |
| KR | 20110074912 A | 7/2011 |
| KR | 20130142972 A | 12/2013 |
| KR | 20140084906 A | 7/2014 |
| KR | 20140134246 A | 11/2014 |
| KR | 20150004283 A | 1/2015 |
| WO | 2011037190 A1 | 3/2011 |

OTHER PUBLICATIONS

International Search Report for PCT/KR2019/001547 mailed May 17, 2019.
Written Opinion for PCT/KR2019/001547 mailed May 17, 2019.

* cited by examiner

300 : 310, 320, 330, 342, 344

CHAMBER CLEANING DEVICE AND CHAMBER CLEANING METHOD

CROSS-REFERENCE TO RELATED APPLICATIONS

The present application is a divisional of U.S. patent application Ser. No. 16/966,883, filed Jul. 31, 2020, now U.S. Pat. No. 11,427,906, which is a 35 U.S.C. § 371 National Stage patent application of International patent application PCT/KR2019/001547, filed on Feb. 7, 2019, which claims priority to Korean patent application 10-2018-0015852, filed on Feb. 8, 2018, and Korean patent application 10-2019-0013071, filed on Jan. 31, 2019. The subject matter of these earlier filed applications are hereby incorporated by reference.

TECHNICAL FIELD

The present disclosure relates to a chamber cleaning device and chamber cleaning device, and more particularly, to a chamber cleaning device and chamber cleaning device, which are capable of cleaning the chamber which is contaminated while depositing a thin film on a substrate.

BACKGROUND ART

In general, a semiconductor element is manufactured by depositing various materials on a substrate and patterning the resultant substrate. To this end, several stages of processes, such as a deposition process, an etching process, a cleaning process, and a drying process, are performed. Here, the deposition process is performed to form, on a substrate, a thin film having a property required as a semiconductor element. However, during a deposition process for forming a thin film, a byproduct is deposited not only on a desired region on a substrate but also inside a chamber, in which the deposition process is performed.

The byproduct deposited inside the chamber is peeled off when the thickness thereof increases, and hence causes particles to be generated. Particles generated as such enter into a thin film formed on a substrate or are attached to the surface of the thin film. Thus, the particles cause defects of a semiconductor and increase the defect rate of a product. Thus, it is necessary to remove these byproduct deposited inside the chamber before the byproduct is peeled off.

In particular, in case of metal-organic chemical vapor deposition (MOCVD), a deposition device, which performs the MOCVD, generates lots of particles during a deposition process, and thus is required to be very frequently cleaned. But in this case, the byproduct inside the chamber is mainly cleaned by wet etching, and is mostly performed by an operator manually while the chamber is open. Thus, there was a problem in that cleaning costs rise and it was difficult to secure the repeatability and utilization rate of equipment.

RELATED ART DOCUMENTS (Patent document 1) KR10-2011-0074912A

Technical Problem

The present disclosure provides an apparatus and a method which are capable of effectively in-situ cleaning a byproduct generated during a deposition process for forming a thin film.

Technical Solution

In accordance with an exemplary embodiment, a chamber cleaning method is a method for cleaning a chamber for depositing a zinc oxide, the method including: supplying a chlorine (Cl)-containing gas and a hydrogen (H)-containing gas into a chamber; activating and reacting the separately supplied gases with each other inside the chamber to generate a reaction gas; and firstly cleaning the chamber with the reaction gas.

In the supplying of the chlorine (Cl)-containing gas and the hydrogen (H)-containing gas, the chlorine (Cl)-containing gas and a hydrogen (H)-containing gas may be separately supplied.

The reaction gas may include a hydrogen chloride (HCl) gas.

In the generating of the reaction gas, the chlorine (Cl)-containing gas may be activated outside a gas injection part, and the hydrogen (H)-containing gas may be activated from inside the gas injection part.

In the generating of the reaction gas, the chlorine (Cl)-containing gas and the hydrogen (H)-containing gas may be activated in activation regions having mutually different sizes.

In the generating of the reaction gas, the chlorine (Cl)-containing gas and the hydrogen (H)-containing gas which are activated inside the chamber may be reacted outside the gas injection part.

The chamber cleaning method may further include: secondly cleaning the chamber with an activated hydrogen (H)-containing cleaning gas; and thirdly cleaning the chamber with an activated oxygen (O)-containing cleaning gas.

The secondly cleaning may include: removing a chlorine (Cl) component remaining inside the chamber, and the thirdly cleaning may include removing a hydrogen (H) component remaining inside the chamber.

The removing of the chlorine (Cl) component may be performed by activating the hydrogen (H)-containing cleaning gas inside the chamber, and the removing of the hydrogen (H) component may be performed by activating the oxygen (O)-containing cleaning gas inside the chamber.

The hydrogen (H)-containing cleaning gas may be supplied into the chamber through a same path as the hydrogen (H)-containing gas.

The firstly cleaning, the secondly cleaning, and the thirdly cleaning may be performed at a temperature of approximately 150-350° C.

In accordance with another exemplary embodiment, a chamber cleaning apparatus includes: a first gas supply part configured to supply a first gas; a second gas supply part configured to supply a second gas; a gas injection part installed inside a chamber and including a first gas supply path for supplying the first gas and a second gas supply path for supplying the second gas, the first gas supply path and the second gas supply path being separately formed; a power supply part connected to the gas injection part and configured to apply power to the gas injection part; and a control unit configured to control the gas injection part and the power supply part so as to generate a reaction gas for etching a byproduct inside the chamber by activating the first gas and the second gas and reacting the first gas and the second gas with each other.

The gas injection part may include: an upper frame installed inside the chamber; and a lower frame installed to be spaced apart downward from the upper frame, wherein a heating means may be installed inside at least one of the upper frame or the lower frame.

The heating means may be installed on at least one of the upper frame or the lower frame so as to be split in plurality.

A cooling means may be installed inside at least one of the upper frame or the lower frame.

The gas injection part may include: a plurality of first electrodes provided to be arranged along an injection surface; and second electrodes provided on the periphery of the first electrodes so as to be spaced apart from the first electrodes, and the power supply part may apply power to at least one of the first electrode or the second electrode.

The first gas supply path may be provided to pass through the first electrodes, and the second gas supply path may be provided so as to be connected to separation spaces between the first electrodes and the second electrodes.

The control unit may control supply amounts of the first gas and the second gas according to types of the first gas, the second gas, and the reaction gas.

The chamber cleaning apparatus may further include: an oxygen (O)-containing gas supply part configured to supply an oxygen (O)-containing gas, and the gas injection part may supply the oxygen (O)-containing gas into the chamber through at least one of the first gas supply path or the second gas supply path.

Advantageous Effects

In accordance with the chamber cleaning apparatus and the chamber cleaning method, a byproduct inside the chamber is etched by using a reaction gas which is generated by activating and reacting the first gas and the second gas, which are separately supplied into the chamber through mutually different paths, and thus, the phenomenon may be prevented in which the gas injection part is etched and damaged and particles are generated in the cleaning process.

In addition, the plasma density inside the chamber may be improved and the first and second gases separately supplied may be effectively reacted with each other by forming plasma using the first electrode and the second electrode which are provided along the injection surface of the gas injection part.

In addition, a heating means is embedded in at least one of the upper frame or the lower frame, so that the temperature inside the chamber is raised and an optimal temperature for cleaning is maintained, and the byproduct inside the chamber may be removed more effectively.

Furthermore, in accordance with the chamber cleaning apparatus and the chamber cleaning method, it is possible to perform an in-situ cleaning without detaching the chamber in chemical vapor deposition process which requires frequent cleaning, and thus, improved work efficiency, high repeatability of apparatus, and high utilization rate of equipment may be secured.

DETAILED DESCRIPTION

Figure 1:
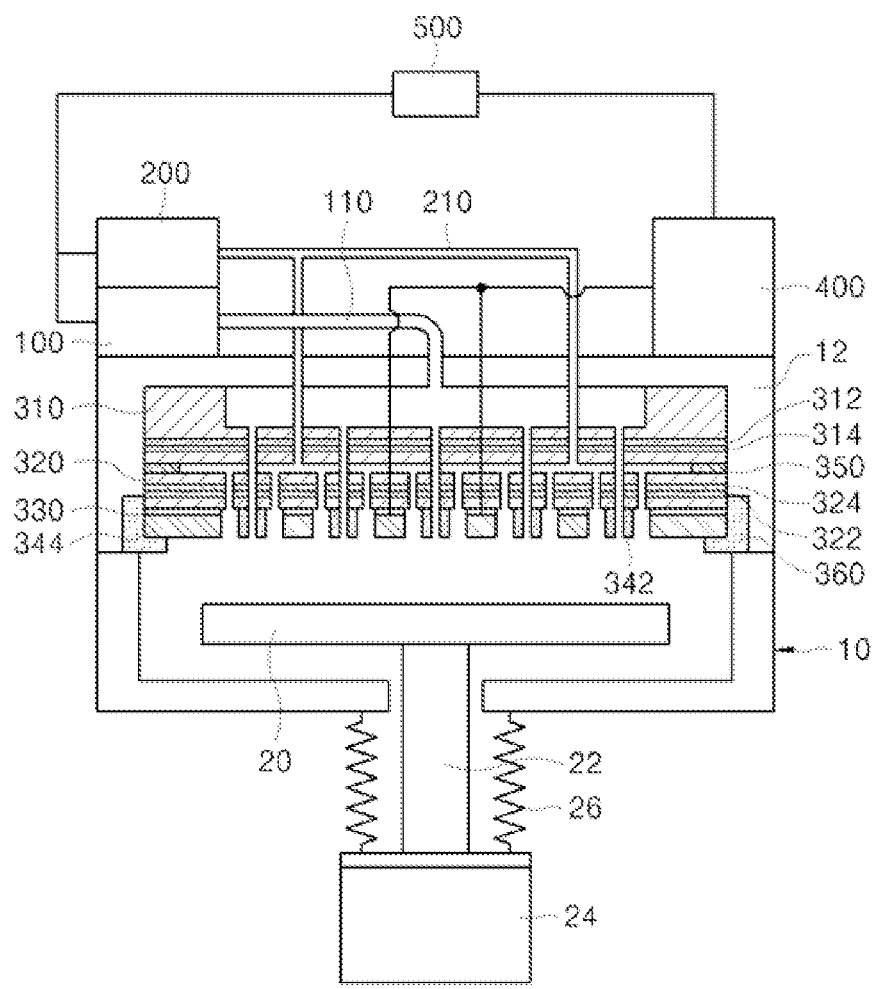
FIG. 1 is a schematic view showing a chamber cleaning apparatus in accordance with an exemplary embodiment.

Hereinafter, exemplary embodiments will be described in detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. In the drawings, like reference numerals refer to like elements throughout.

FIG. 1 is a schematic view showing a chamber cleaning apparatus in accordance with an exemplary embodiment. In addition, FIG. 2 is a schematic view showing a gas injection part 300 in accordance with an exemplary embodiment, and FIG. 3 is an exploded view showing the gas injection part 300 shown in FIG. 2 in accordance with an exemplary embodiment.

Figure 2:
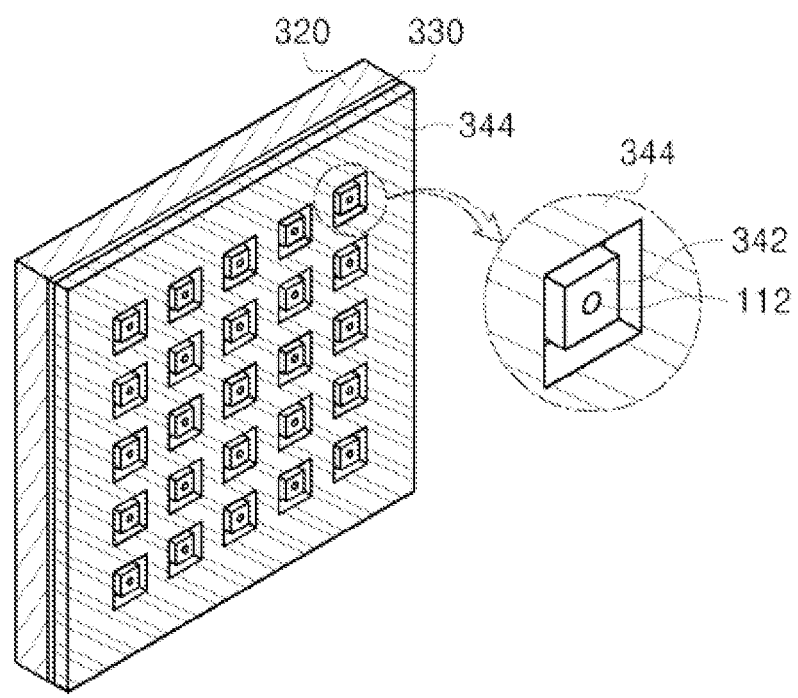
FIG. 2 is a schematic view showing a gas injection part in accordance with an exemplary embodiment.
Figure 3:
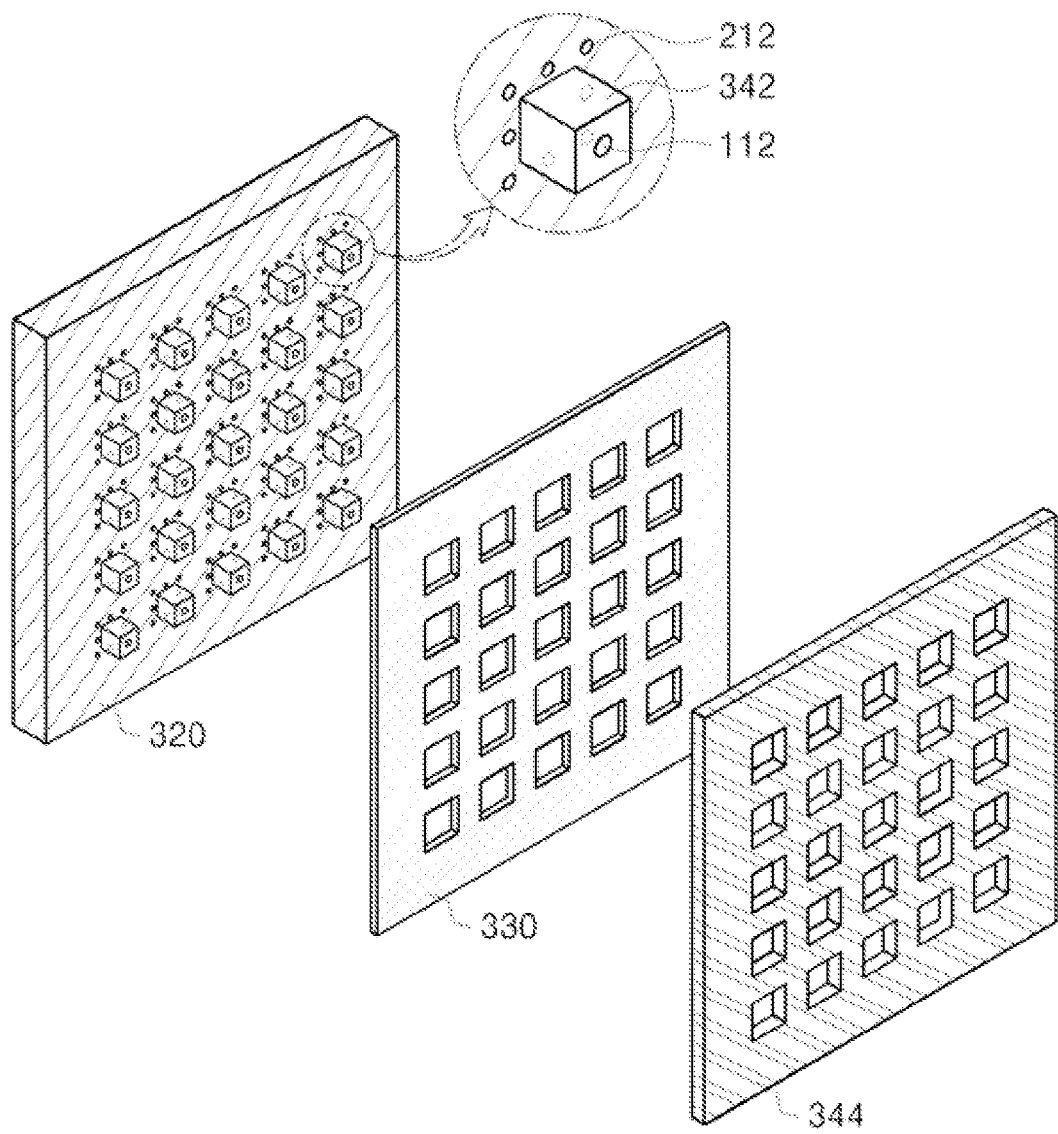
FIG. 3 is an exploded view showing the gas injection part shown in FIG. 2 in accordance with an exemplary embodiment.

Referring to FIGS. 1 to 3, a chamber cleaning apparatus in accordance with an exemplary embodiment, includes: a first gas supply part 100 which provides a first gas; a second gas supply part 200 which provides a second gas; a gas injection part 300 installed inside a chamber 10 and formed to branch into a first gas supply path 110 for supplying the first gas and a second gas supply path 210 for supplying the second gas; a power supply part 400 connected to the gas injection part 300 to supply power to the gas injection part 300; and a control unit 500 which controls the gas injection part 300 and the power supply part 400 so that the first gas and the second gas are activated and react with each other to thereby generate a reaction gas for etching a byproduct inside the chamber 10.

A chamber cleaning apparatus in accordance with an exemplary embodiment removes byproducts generated, for example, during a thin film deposition process and deposited inside the chamber 10. Thus, the chamber 10 provides a reaction space for performing a substrate treatment process. Here, the substrate treatment process may be a process for depositing, on a substrate, a zinc oxide (IGZO) doped with indium and gallium, and in this case, the byproduct deposited inside the chamber 10 may include a zinc oxide doped with indium and gallium. In addition, in this case, a substrate support part 20 which supports at least one substrate may be installed inside the chamber 10. Here, the substrate support part 20 may be installed so as to move up or down according to the substrate treatment process, and may also be installed to rotate. Such vertical movement and rotation of the substrate support part 20 may be performed by means of a support shaft 22 passing through the bottom surface of the chamber 10 and a drive part 24 connected to a support shaft 22 and the support shaft 22, and the support shaft 22 exposed from the bottom surface of the chamber 10 may be sealed by a bellows 26.

The first gas supply part 100 and the second gas supply part 200 may each be installed outside the chamber 10, and supply the gas injection part 300 with the first gas and the second gas. The first gas and the second gas are each activated and reacted with each other in the reaction space inside the chamber 10, and generate a reaction gas for etching and washing byproducts inside the chamber 10. In order to effectively etch the byproduct including an organic metal oxide such as a zinc oxide, the reaction gas may contain a hydrogen chloride (HCl) gas, and thus, any one of the first gas or the second gas may include a chlorine (Cl)-containing gas, and the other may include hydrogen (H)-containing gas. In addition, the chlorine (Cl)-containing gas may include at least any one among $Cl_2$, $BCl_3$, $ClF_3$, or $ClF_4$, and the hydrogen (H)-containing gas may include at least any one among $H_2$, $CH_4$ or $H_2O$, but the exemplary embodiment is not limited thereto, and various gases including chlorine (Cl) or hydrogen (H) as an element may, of course, be used respectively for the first and second gases.

As such, when the chlorine (Cl)-containing gas and the hydrogen (H)-containing gas are respectively used as the first gas and second gas, the first and second gases may be activated, react with each other, and generate a hydrogen chloride (HCl) gas, and by using the generated hydrogen chloride (HCl) gas, the byproducts including organic metal oxides such as zinc oxide may effectively be etched. A specific process for generating the hydrogen chloride (HCl) gas by allowing the first gas and second gas to react with each other will be described later.

The gas injection part 300 is detachably installed on the lower surface of a chamber lid 12 and has therein the first gas supply path 110 for supplying the first gas and the second gas supply path 210 for supplying the second gas. Here, the first gas supply path 110 and the second gas supply path 210 are separately provided, and may separately supply the first gas and the second gas into the chamber 10.

In order to remove the byproducts deposited inside the chamber 10 and including organic metal oxides such as zinc oxide, when a hydrogen chloride (HCl) gas is supplied into the chamber 10, the hydrogen chloride (HCl) gas may directly be injected through the gas injection part 300, or be injected by being mixed with the hydrogen (H)-containing gas and the chlorine (Cl)-containing gas. However, when the hydrogen chloride (HCl) gas is directly be injected through the gas injection part 300, the gas injection part 300 is etched and damaged by the hydrogen chloride (HCl) and rather generates particles, and thus, the gas supply path of the gas injection part 300 is clogged. In addition, when the hydrogen chloride (HCl) and the hydrogen (H)-containing gas are mixed and injected through the gas injection part 300, the hydrogen chloride (HCl) and the hydrogen (H)-containing gas violently react with each other inside the gas injection part 300, and thus, there was a problem in that the above limitation became more serious. Conversely, when the gas supply path for supplying the hydrogen chloride (HCl) and the gas supply path for supplying the hydrogen (H)-containing gas are separated inside the gas injection part 300 according to the exemplary embodiment, the limitation of damage to the gas injection part 300 may be prevented, and the inside of the chamber 10 may be cleaned more effectively.

To this end, the gas injection part 300 may include an upper frame 310 and a lower frame 320. Here, the upper frame 310 is detachably coupled to the lower surface of the chamber lid 12, and a portion of the upper surface thereof, for example, the central portion of the upper surface is spaced apart a predetermined distance from the lower surface of the chamber lid 12. Accordingly, the first gas supplied from the first gas supply part 100 may be spread and temporarily stored in a space between the upper surface of the upper frame 310 and the lower surface of the chamber lid 12. In addition, the lower frame 320 is installed to be spaced apart a predetermined distance from the lower surface of the upper frame 310. Accordingly, the second gas supplied from the second gas supply part 200 may be spread and temporarily stored in a space between the upper surface of the lower frame 320 and the lower surface of the upper frame 310. Here, the upper frame 310 and the lower frame 320 may be integrally provided by being connected along the outer peripheral surfaces thereof and forming a separation space, and may, of course, be also formed in a structure which seals the peripheral surfaces by means of a separate sealing member 350.

That is, the first gas supply path 110 is provided such that the first gas supplied from the first gas supply part 100 is spread and temporarily stored in the space between the lower surface of the chamber lid 12 and the upper frame 310, passes through the upper frame 310 and the lower frame 320, and is supplied into the chamber 10. In addition, the second gas supply path 210 is provided such that the second gas supplied from the second gas supply part 200 is spread and temporarily stored in the space between the lower surface of the upper frame 310 and the upper surface of the lower frame 320, passes through the lower frame 320, and is supplied into the chamber 10. The first gas supply path 110 and the second gas supply path 210 do not communicate with each other, and thus, the first gas and the second gas are separately supplied from the gas injection part 300 into the chamber 10.

Here, first heating means 312 and second heating means 322 may be installed inside at least one of the upper frame 310 or the lower frame 320. During a cleaning process, byproducts may be adhered to the inside of the apparatus due to a low cleaning temperature. This phenomenon more seriously occurs at the lower surface of the lower frame 320 and at a first electrode 342 and a second electrode 344 to be described later. Thus, a first heating means 312 is installed inside the upper frame 310, and a second heating means 322 is installed inside the lower frame 320, so that byproducts may be prevented from adhering to the upper frame 310, the lower frame 320, the first electrode 342 and the second electrode 344, and even when adhesion of byproducts occur, the byproducts may easily be removed. In this case, the first heating means 312 and the second heating means 322 may be formed in heating lines.

In addition, the first heating means 312 and the second heating means 322 may be installed so as to be split in plurality in at least one of the upper frame 310 or the lower frame 320. In this case, the first heating means 312 and the second heating means 322 installed to be split in plurality may heat each of the regions of at least one of the upper frame 310 or the lower frame 320. For example, the first heating means 312 and the second heating means 322 may each be installed in two, three, or four regions in at least one of the upper frame 310 or the lower frame 320, and in order to further raise the temperature of the chamber wall side, which has a lower temperature than the center side inside the chamber 10, the closer to the chamber wall, the more the heating means may be disposed. As such, the temperature inside the chamber 10 is raised by embedding the first heating means 312 and the second heating means 322 in at least one of the upper frame 310 or the lower frame 320, and an optimal temperature for cleaning is maintained, and thus, byproducts inside the chamber 10 may be removed more effectively.

Meanwhile, the second heating means 322 directly heat the lower frame 320. At this point, the heat generated from the lower frame 320 may necessarily be transmitted effectively to an end portion of the first electrodes 342 facing the substrate support part 20. Accordingly, the lower frame 320 and the first electrodes 342 come into metal contact with each other and heat conductivity may be improved.

When at least one of the upper frame 310 or the lower frame 320 is heated by the first heating means 312 and the second heating means 322, the temperature inside the chamber 10 may be maintained at a temperature of approximately 150-350° C. inclusive. Accordingly, the cleaning temperature at which the cleaning process is performed may be maintained at the temperature of approximately 150-350° C. inclusive. When the cleaning temperature is lower than approximately 150° C., a cleaning efficiency rapidly decreases, and when the cleaning temperature exceeds approximately 350° C., there is a problem in that deformation of an O-ring and a related structure may occur, so that the temperature inside the chamber 10 may be heated to a temperature of approximately 150-350° C. inclusive by the first heating means 312 and the second heating means 322, and maintain the temperature. Thus, byproducts generated inside the chamber may effectively be removed.

Meanwhile, first cooling means 314 and second cooling means 324 may be installed inside at least one of the upper frame 310 or the lower frame 320. These first cooling means 314 and second cooling means 324 prevent the upper frame 310 or the lower frame 320 from being deformed due to a high deposition temperature, for example, during a deposition process. The first cooling means 314 and the second cooling means 324 may be provide in cooling lines, and may be split in plurality in at least one of the upper frame 310 or the lower frame 320, as described on the first heating means 312 and the second heating means 322.

FIG. 1 exemplarily illustrates a structure in which the first heating means 312 and the second heating means 322 and the first cooling means 314 and the second cooling means 324 are installed to be laminated over the entire region inside the upper frame 310 and the lower frame 320, but the positions and the installation regions of the upper frame 310 and the lower frame 320 may of course be variously modified and applied.

The gas injection part 300 may include an insulating plate 330 which is installed on the lower surface of the lower frame 320. Here, the insulating plate 330 functions to electrically insulate the second electrode 344 to be described later and the lower frame 320, and may be detachably installed on the lower surface of the lower frame 320 so as to cover the remaining regions of the lower surface of the lower frame 320 excluding the region in which the first electrode 342 is formed, or the remaining region of the lower surface of the lower frame 320 excluding the region in which the first electrode 342 is formed and the region in which the first electrode 342 and the second electrode 344 are spaced apart from each other.

In addition, the gas injection part 300 may include a plurality of first electrodes 342 which are provided to be arranged along an injection surface; and second electrodes 344 provided around the first electrodes 342 so as to be spaced apart from the first electrodes 342.

The first electrodes 342 are provided to protrude downward on the lower surface of the lower frame 320 and the plurality of first electrodes 342 are provided to be arranged along the injection surface of the gas injected from the gas injection part 300. In addition, the first electrode 342 may be integrally formed with the lower frame 320. Here, the first electrodes 342 may protrude so as to have circular or polygonal cross-section, and each of the first electrodes 342 may be convexly or concavely rounded so as to have a predetermined curvature at corner edges in order to prevent and minimize arcing generated in edge portions.

The second electrodes 344 are provided on the lower surface of the insulating plate 330 along the periphery of the first electrode 342 so as to be spaced apart from the first electrodes 342. Here, the second electrodes 344 pass through in circular or polygonal shapes according to the shapes of the first electrodes 342 and surround side surfaces of respective first electrodes 342 so as to be spaced apart from the first electrodes 342.

Here, the first gas supply path 110 may be provided to pass through the first electrodes 342, and the second gas supply path 210 may be provided to be connected to a separation space between the first electrodes 342 and the second electrodes 344. That is, first gas injection holes 112 for supplying the first gas is provided to pass through the first electrodes 342, and second gas injection holes 212 may be provided to pass through the lower frame 320 or the insulating plate 330 in the separation space between the first electrodes 342 and the second electrodes 344. Here, the plurality of second gas injection holes 212 may also be provided along the separation space between the first electrodes 342 and the second electrodes 344. In addition, insulating bodies 360 may be provided on each side surface of the lower frame 320 and in the peripheral portions of the second electrodes 344, and may electrically insulate the chamber lid 12 and the second electrodes 344.

The power supply part 400 is connected to the gas injection part 300 and applies power to the gas injection part 300. Here, the power supply part 400 may apply power to at least one of the first electrodes 342 or the second electrodes 344. That is, the power supply part 400 may be configured such that power is applied to the first electrodes 342 and the second electrodes 344 are grounded, or conversely, such that power is applied to the second electrodes 344 and the first electrodes 342 are grounded. In addition, the first electrodes 342 and the second electrodes 344 may, of course, be also applied with mutually different power. In addition, the substrate support part 20 may be grounded, but the power supply part 400 may of course apply, to the substrate support part 20, power different from that of at least one of the first electrodes 342 or the second electrodes 344.

The power applied by the power supply part 400 may be high-frequency power, or radio frequency power, for example, low-frequency (LF) power, middle-frequency (MF) power, high-frequency (HF) power, or very high-frequency (VHF) power. At this point, the LF power may have frequency within a range of approximately 3 kHz to approximately 300 kHz, the MF power may have frequency within a range of approximately 300 kHz to approximately 3 MHz, the HF power may have frequency within a range of approximately 3 MHz to approximately 300 MHz, and the VHF power may have frequency within a range of approximately 30 MHz to approximately 300 MHz.

In addition, the power supply part 400 may also include an impedance matching circuit for matching load impedance and source impedance of plasma power applied to the first electrodes 342 and the second electrodes 344. The impedance matching circuit may be provided so as to include at least two impedance elements composed of at least one among a variable capacitor or a variable inductor.

The control unit 500 may control the gas injection part 300 and the power supply part 400 so that the first gas and the second gas are activated and allowed to react with each other so as to generate a reaction gas for etching a byproduct inside the chamber 10. The control unit 500 controls the supply amount and supply flow rate of each of gases supplied from the gas injection part 300 and overally controls the type, frequency range, and the like of the power applied to the gas injection part 300 from the power supply part 400, so that a reaction gas for etching a byproduct inside the chamber 10, for example, a hydrogen chloride (HCl) gas may be generated from the first gas and the second gas which are activated. Here, the control unit 500 may control the supply amounts of the first gas and the second gas according to the type of the first gas, the second gas, and the reaction gas. For example, when chlorine ($Cl_2$) gas is used as the first gas and hydrogen ($H_2$) gas is used as the second gas, the control unit 500 may control the supply amount of the first gas and the second gas to be the same. Conversely, when boron trichloride gas ($BCl_3$) is used as the first gas, and hydrogen ($H_2$) gas is used as the second gas, the supply amount of the second gas may be controlled to be more than the supply amount of the first gas. As such, the control unit 500 controls the supply amounts of the first gas and the second gas according to the types of the first gas and the second gas, and may thus generate a reaction gas inside the chamber 10 with maximum efficiency.

Figure 4:
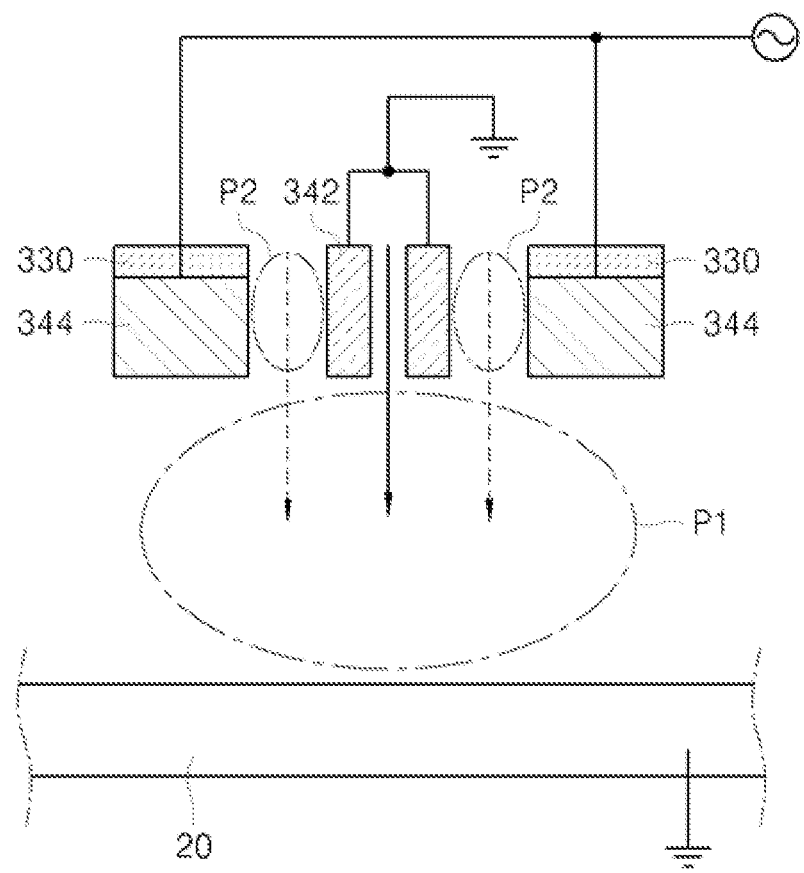
FIG. 4 is a view showing a state of forming a plasma in accordance with an exemplary embodiment.

FIG. 4 is a view showing a state of forming a plasma in accordance with an exemplary embodiment. FIG. 4 exemplarily illustrates that the first electrode 342 and the substrate support part 20 are grounded, and power is applied to the second electrode 344, but the power application structure is not, of course, limited thereto.

As shown in FIG. 4, the first gas may be supplied into the chamber 10 along the arrows depicted by a straight line, and the second gas may be supplied into the chamber 10 along the arrows depicted by dotted lines. The first gas is supplied into the chamber 10 by passing through the inside of the first electrode 342, and the second gas is supplied into the chamber 10 through a separation space between the first electrode 342 and the second electrode 344.

Here, the first electrode 342 and the substrate support part 20 are grounded, and when power is applied to the second electrode 344, a first activation region, that is, a first plasma region P1 is formed between the gas injection part 300 and the substrate support part 20, and a second activation region, that is, a second plasma region P2 is formed between the first electrode 342 and the second electrode 344. That is, mutually different power is applied to the second electrode 344 and the substrate support part 20, so that the first plasma region P1 is formed between the second electrode 344 and the substrate support part 20, and mutually different power is also applied to the first electrode 342 and the second electrode 344, and thus, the second plasma region P2 are formed between the first electrode 342 and the second electrode 344.

Thus, when the first gas is supplied through the first electrode 342, the first gas is activated at the first plasma region P1 formed outside the gas injection part 300. In addition, when the second gas is supplied through the separation space between the first electrode 342 and the second electrode 344, the second gas is activated between first electrode 342 and the second electrode 344 corresponding to the inside of the gas injection part 300, that is, activated over the region from the second plasma region P2 to the first plasma region P1. Thus, the chamber cleaning apparatus in accordance with an exemplary embodiment may activate the first gas and the second gas at plasma regions having mutually different sizes. As such, in case of the chamber cleaning apparatus in accordance with an exemplary embodiment may improve the plasma density inside the chamber 10 by expanding the region, in which a plasma is formed, up to the region between the first electrode 342 and the second electrode 344. In addition, since the first gas and the second gas are activated in the mutually different plasma regions, each gas may be distributed to optimal supply paths for generating a reaction gas. The first gas and the second gas which are activated as such react outside the gas injection part 300, for example, in the first plasma region P1, the reaction gas for etching and cleaning byproducts inside the chamber 10 is generated.

Hereinafter, referring to FIG. 5, a chamber cleaning method in accordance with an exemplary embodiment will be described in detail. In describing the chamber cleaning method in accordance with an exemplary embodiment, the description overlapping the chamber cleaning apparatus described above will be omitted.

Figure 5:
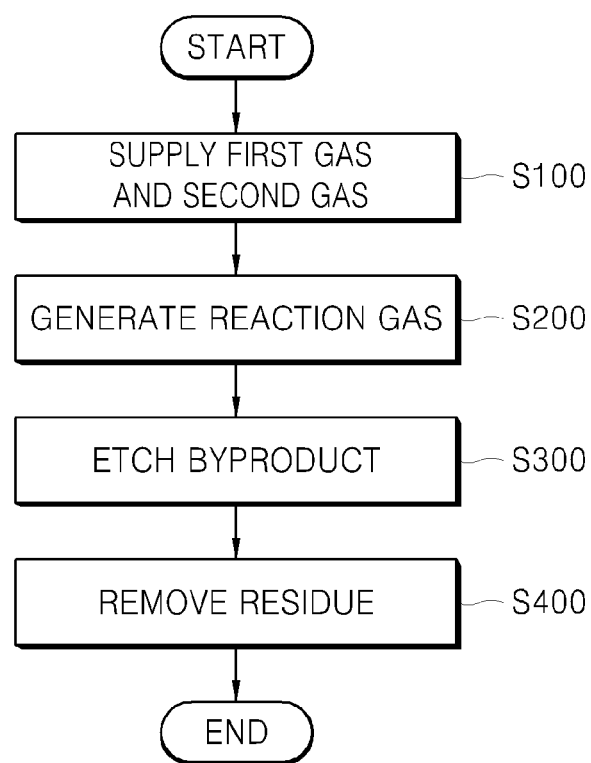
FIG. 5 is a schematic view showing a chamber cleaning method in accordance with an exemplary embodiment.

FIG. 5 is a schematic view showing a chamber cleaning method in accordance with an exemplary embodiment. Referring to FIG. 5, a chamber cleaning method in accordance with an exemplary embodiment includes: supplying a first gas and a second gas into a chamber 10 through mutually different paths (S100); activating and allowing the first gas and the second gas to react with each other to generate a reaction gas (S200); etching a byproduct inside the chamber 10 with the reaction gas (S300); and removing a residue remaining inside the chamber 10 (S400).

In the supplying of the first gas and the second gas (S100), the first gas supplied from a first gas supply part 100 and the second gas supplied from a second gas supply part 200 are supplied into the chamber 10 through a gas injection part 300. That is, the first gas and the second gas may be simultaneously be supplied from the single gas injection part 300 installed inside the chamber 10, and here, the first gas and the second gas may be supplied into the chamber 10 through a first gas supply path 110 and a second gas supply path 210 which are formed as mutually different paths in the gas injection part 300.

Here, the first gas and the second gas are for generating the reaction gas by reacting with each other in a reaction space inside the chamber 10, and any one of the first gas or the second gas may include a chlorine (Cl)-containing gas, and the other of the first gas or the second gas may include a hydrogen (H)-containing gas. In addition, the chlorine (Cl)-containing gas may include at least any one among $Cl_2$, $BCl_3$, $ClF_3$, or $ClF_4$, and the hydrogen (H)-containing gas may include at least any one among $H_2$, $CH_4$ or $H_2O$, but the exemplary embodiment is not limited thereto, and various gases including chlorine (Cl) or hydrogen (H) as an element may be used respectively for the first and second gases, as described above. Hereinafter, for convenience in description, a case in which the chlorine (Cl)-containing gas is used as the first gas, and the hydrogen (H)-containing gas is used as the second gas is exemplarily described, but the same may, of course, be applied in the converse case.

In addition, the first gas may include the chlorine (Cl)-containing gas, and the second gas may include the hydrogen (H)-containing gas, but each gas may further include, aside from the chlorine (Cl)-containing gas and the hydrogen (H)-containing gas, at least one non-reactive gas among argon (Ar), xenon (Xe), or helium (He). In this case, the non-reactive gas may function as a carrier gas, or prevent the chlorine (Cl)-containing gas and the hydrogen (H)-containing gas from backflow, and, when power is applied, may improve discharge efficiency for generating a plasma.

The first gas and the second gas are separately supplied into the chamber 10 along respective separate paths inside the gas injection part 300. That is, the first gas is supplied into the chamber 10 along the first gas supply path 110 formed inside the gas injection part 300, and the second gas is supplied into the chamber 10 along the second gas supply path 210 which is formed inside the gas injection part 300 and does not communicate with the first gas supply path 110. As such, first gas and the second gas are separately supplied into the chamber 10 along respective separate paths inside the gas injection part 300, so that the first gas and the second gas may be prevented from reacting and thus, damage to the gas injection part 300 may be prevented, and the inside of the gas injection part 300 may be more effectively cleaned.

In addition, in the supplying of the first gas and second gas (S100), the supply amounts of the first gas and second gas are controlled and supplied according to the types of the first gas, the second gas, and the reaction gas. That is, as described above, the control unit 500 may control the supply amounts of the first gas and second gas to be the same, or control the supply amounts of one of the first gas and second gas to be more than those of the other of the first gas and second gas.

In the activating and allowing the first gas and second gas to react with each other to generate a reaction gas (S200), the first gas and second gas are activated in a plasma region formed inside the chamber 10, and letting the first gas and second gas which are activated in the plasma region react with each other and thereby generating the reaction gas. To this end, as described above, the power supply part 400 may apply power to at least one of the first electrode 342 or the second electrode 344, apply power only to the first electrode 342 or the second electrode 344, or apply mutually different power to the first electrode 342 or the second electrode 344.

In addition, in the gas injection part 300, the first electrode 342 may be formed to protrude downward on the lower surface of a lower frame 320 and be formed in plurality along an injection surface of the gas injected from the gas injection part 300, and the second electrode 344 may be formed on the lower surface of an insulating plate 330 along the peripheries of the first electrodes 342 so as to be spaced apart from the first electrodes 342. That is, the first electrodes 342 and the second electrode 344 may be formed along the injection surface of the gas injection part 300, and in this case, a separate remoter plasma source (RPS) is not required, and a plasma density may be improved, as well as less limitation in temperature. Regarding detailed structures of the gas injection part 300 and the first electrode 342 and the second electrode 344, the same description may be applied as described above regarding the chamber cleaning apparatus in accordance with an exemplary embodiment, and thus, overlapping description will be omitted.

Here, in the generating of the reaction gas (S200), the first gas may be activated outside the gas injection part 300, and the second gas may be activated inside the gas injection part 300. That is, as described above in FIG. 4, when the first gas is supplied through the first electrode 342, the first gas is activated in the first plasma region P1 formed outside the gas injection part 300. In addition, when the second gas is supplied through a separation space between the first electrode 342 and the second electrode 344, the second gas is activated between first electrode 342 and the second electrode 344 corresponding to the inside of the gas injection part 300, that is, activated from the second plasma region P2 over to the first plasma region P1. Accordingly, in the generating of a reaction gas (S200), the first gas and the second gas may be activated in plasma regions having mutually different sizes, and the region in which the plasma is generated may be extended to a region between the first electrode 342 and the second electrode 344. Thus, not only the plasma density inside the chamber 10 may be improved, but also the first gas and the second gas may be distributed through optimal supply paths for generating a reaction gas.

In addition, the activated first gas and the second gas, for example, the chlorine (Cl)-containing gas and the hydrogen (H)-containing gas may be supplied into the chamber 10 through separate paths, and a portion thereof may be directly used as a cleaning gas for cleaning the chamber 10. However, the activated chlorine (Cl)-containing gas and the hydrogen (H)-containing gas have high mutual reactivity, and thus react with each other outside the gas injection part 300, for example, in the first plasma region P1. Thus, a reaction gas for etching a byproduct inside the chamber 10, for example, hydrogen chloride (HCl) gas is generated. The generated hydrogen chloride (HCl) gas serves as a main cleaning gas for efficiently etching a byproduct including an organic metal oxide, such as a zinc oxide deposited inside the chamber 10.

In the etching of a byproduct inside the chamber 10 with the reaction gas (S300), the generated reaction gas is physicochemically reacted with the byproducts inside the chamber 10 and thereby etches the byproducts. For example, the hydrogen chloride (HCl) gas physicochemically reacts with the byproducts deposited inside the chamber 10 and may efficiently etch and firstly clean the byproduct including an organic metal oxide, such as a zinc oxide, generated from a metal-organic chemical vapor deposition (MOCVD) process or the like.

In the removing of a residue (S400), the residue generated inside the chamber 10 in the above-mentioned etching of the byproduct (S300) is discharged to the outside of the chamber 10 and removed. Here, the removing of a residue (S400) may include: secondly cleaning the chamber with an activated hydrogen (H)-containing cleaning gas; and thirdly cleaning the chamber with an activated oxygen (O)-containing cleaning gas. In addition, the secondly cleaning may include: removing a chlorine (Cl) component remaining inside the chamber and the thirdly cleaning may include removing a hydrogen (H) component remaining inside the chamber.

When the activated chlorine (Cl)-containing gas and hydrogen (H)-containing gas are reacted to generate a hydrogen chloride (HCl) gas, and the byproduct inside the chamber 10 is etched by the generated chlorine (Cl) gas, residues of chlorine (Cl) components including chlorine (Cl) atoms, chlorine (Cl) radicals, chlorine ions, and electrons which are generated by the activated chlorine (Cl)-containing gas and the hydrogen chloride (HCl) gas may remain inside the chamber 10. Thus, in order to remove residues of such chlorine (Cl) components, the inside of the chamber 10 is secondly cleaned by performing a hydrogen plasma treatment with the activated hydrogen (H)-containing cleaning gas. For the hydrogen plasma treatment, a hydrogen plasma may be supplied into the chamber 10 by using a remote plasma, but the hydrogen plasma treatment may directly be performed in the chamber 10 by activating the hydrogen (H)-containing cleaning gas supplied into the chamber 10, and when using a hydrogen ($H_2$) gas as the second gas, the hydrogen plasma treatment may also be performed by using the second gas as it is. A hydrogen (H) radical formed by such a hydrogen plasma treatment reacts with a chlorine (Cl) component, and thus, a residue of a chlorine (Cl) component remaining inside the chamber 10 is removed.

In addition, after the hydrogen plasma treatment, residues are remained in the chamber 10, which have hydrogen (H) components including the activated hydrogen (H)-containing gas, and hydrogen (H) atoms, hydrogen (H) radicals, hydrogen (H) ions and electrons which are generated after the hydrogen plasma treatment. Thus, in order to remove residues of such hydrogen (H) components, the inside of the chamber 10 is thirdly cleaned by performing an oxygen plasma treatment with an activated oxygen (O)-containing cleaning gas. An oxygen plasma may be supplied into the chamber 10 by using a remote plasma in the same way as in the case of the hydrogen plasma, but may be directly performed inside the chamber 10 by activating the oxygen (O)-containing cleaning gas supplied into the chamber 10. In this case, an oxygen (O)-containing gas supply part (not shown) which supplies the oxygen (O)-containing cleaning gas may further be provided, and the oxygen (O)-containing gas, for example, an oxygen gas ($O_2$) may be supplied into the chamber 10 through the gas injection part 300.

Here, the hydrogen-containing cleaning gas for the hydrogen plasma treatment and the oxygen-containing cleaning gas for the oxygen plasma treatment may be supplied into the chamber 10 through the same path as that of at least one of the first gas and the second gas. In addition, as described above, the second gas supply path 210 is formed so as to be connected to the separation space between the first electrode 342 and the second electrode 344 to which power is applied. Therefore, in order to more efficiently generate the hydrogen plasma or the oxygen plasma with a high density, the hydrogen-containing cleaning gas or the oxygen-containing cleaning gas provided for the hydrogen plasma treatment or the oxygen plasma treatment may be supplied into the chamber 10 through the second gas supply path 210.

These first cleaning step, the second cleaning step and the third cleaning step may be performed at a temperature of approximately 150° C. to approximately 350° C. inclusive. As described above, heating means 312 and 322 may be installed in at least one of the upper frame 310 or the lower frame 320, and thus, the inside of the chamber may be controlled at a temperature of approximately 150° C. to approximately 350° C. in each cleaning step by heating using the heating means 312 and 322. In this case, as described above, an optimal temperature range is provided to prevent the deformation of an O-ring and related structures and to remove a byproduct.

The chamber cleaning method in accordance with an exemplary embodiment may be performed with a substrate treatment process in-situ. That is, a substrate is mounted on the substrate support part 20, and for example, a metal-organic chemical vapor deposition process is performed, and a zinc oxide, that is, an indium and gallium-doped zinc oxide (IGZO) is deposited on the substrate, and when the deposition is completed, the substrate is carried to the outside. Subsequently, in order to clean the inside of the chamber 10, the first gas and the second gas which include a chlorine (Cl)-containing gas and a hydrogen (H)-containing gas are supplied into the chamber 10 without supplying a process gas. When power is applied, the activated first and second gases react, and a hydrogen chloride (HCl) gas is generated, the hydrogen chloride (HCl) gas physicochemically reacts with a byproduct inside the chamber 10, and thus the byproduct is etched and removed. Meanwhile, when the cleaning is completed, the supply of the first gas and the second gas is stopped, and a substrate is carried into the chamber 10 again, and a metal-organic chemical vapor deposition process may be performed.

Thus, in accordance with the chamber cleaning apparatus and the chamber cleaning method, the byproduct inside the chamber 10 is etched by using a reaction gas which is generated by activating and reacting the first gas and the second gas, which are separately supplied into the chamber 10 through mutually different paths, and thus, the phenomenon may be prevented in which the gas injection part 300 is etched and damaged and particles are generated in the cleaning process.

In addition, the plasma density inside the chamber 10 may be improved and the first and second gases separately supplied may be effectively reacted with each other by forming plasma using the first electrode 342 and the second electrode 344 which are provided along the injection surface of the gas injection part 300.

In addition, a heating means is embedded in at least one of the upper frame or the lower frame, so that the temperature inside the chamber is raised and an optimal temperature for cleaning is maintained, and thus, the byproduct inside the chamber may be removed more effectively.

Furthermore, in accordance with the chamber cleaning apparatus and the chamber cleaning method, it is possible to perform an in-situ cleaning without detaching the chamber 10 in a chemical vapor deposition process which requires frequent cleaning, and thus, improved work efficiency, high repeatability of apparatus, and high utilization rate of equipment may be secured.

While preferable exemplary embodiments have been described and illustrated using specific terms, such terms were merely used to explain the exemplary embodiments, and it is obvious that exemplary embodiments and used terms may be variously modified and changed without departing from the spirit and scope as defined by the following claims. Such variously modified embodiments should not be interpreted separated from the spirit and scope of the present disclosure, and but to be included in the scope of the present disclosure.

What is claimed is:

1. A chamber cleaning apparatus comprising:
a first gas supply part configured to supply a first gas, wherein the first gas is a chlorine (Cl)-containing gas;
a second gas supply part configured to supply a second gas, wherein the second gas is a hydrogen (H)-containing gas;
a gas injection part installed inside a chamber and comprising a first gas supply path for supplying the first gas and a second gas supply path for supplying the second gas, the first gas supply path and the second gas supply path being separately formed;
a power supply part connected to the gas injection part and configured to apply power to the gas injection part; and
a control unit configured to control the gas injection part and the power supply part so as to generate a reaction gas for etching a byproduct inside the chamber by activating the first gas and the second gas and reacting the first gas and the second gas with each other,
wherein the gas injection part includes:
an upper frame installed inside the chamber;
a lower frame installed to be spaced apart downward from the upper frame;
a plurality of first electrodes installed below the lower frame and provided to be arranged along an injection surface; and
a second electrode provided on a periphery of the plurality of first electrodes so as to be spaced apart from the plurality of first electrodes,
wherein one of the first gas supply path and the second gas supply path is provided to pass through the first electrodes, and the other of the first gas supply path and second gas supply path extends from above the second electrode toward the second electrode and connects to separation spaces between the first electrodes and the second electrode, which are defined in a lateral direction of the first electrodes, and
wherein the chamber cleaning apparatus further comprises a heating means split in plurality and installed inside at least one of the upper frame or the lower frame.

2. The chamber cleaning apparatus of claim 1, wherein a cooling means is installed inside at least one of the upper frame or the lower frame.

3. The chamber cleaning apparatus of claim 1, wherein the power supply part applies power to at least one of the first electrodes or the second electrode.

4. The chamber cleaning apparatus of claim 1, wherein the control unit controls supply amounts of the first gas and the second gas according to types of the first gas, the second gas, and the reaction gas.

5. The chamber cleaning apparatus of claim 1, further comprising an oxygen (O)-containing gas supply part configured to supply an oxygen (O)-containing gas,
    wherein the gas injection part supplies the oxygen (O)-containing gas into the chamber through at least one of the first gas supply path or the second gas supply path.

6. The chamber cleaning apparatus of claim 1, the byproduct comprises a zinc oxide doped with indium and gallium (IGZO).

\* \* \* \* \*